United States Patent
Hashimoto

(10) Patent No.: US 8,866,489 B2
(45) Date of Patent: Oct. 21, 2014

(54) TEST APPARATUS WITH POWER CUTOFF SECTION HAVING VARIABLE MAXIMUM AND MINIMUM THRESHOLDS

(75) Inventor: Shinichi Hashimoto, Saitama (JP)

(73) Assignee: Advantest Corporation, Tokyo (JP)

( * ) Notice: Subject to any disclaimer, the term of this patent is extended or adjusted under 35 U.S.C. 154(b) by 286 days.

(21) Appl. No.: 13/191,396

(22) Filed: Jul. 26, 2011

(65) Prior Publication Data

US 2012/0187968 A1 Jul. 26, 2012

(30) Foreign Application Priority Data

Sep. 8, 2010 (JP) ................. 2010-200592

(51) Int. Cl.
*G01R 31/00* (2006.01)
*G01R 31/02* (2006.01)
*H03K 17/16* (2006.01)
*H03K 17/30* (2006.01)
*G05F 1/10* (2006.01)
*G01R 31/26* (2014.01)
*G01R 31/28* (2006.01)

(52) U.S. Cl.
CPC ................. *G01R 31/2617* (2013.01); *G01R 31/2839* (2013.01)
USPC .............. 324/537; 324/750.01; 324/762.08; 324/762.09; 327/380; 327/381; 327/384; 327/387; 327/546

(58) Field of Classification Search
CPC ........... G01R 31/3278; G01R 31/3333; G01R 31/3336; G01R 31/327
USPC ............. 324/762.03, 762.05, 762.06, 750.01, 324/750.15, 76.79, 713, 750.03–750.07, 324/762.01–764.01, 418, 420–423, 537, 324/768, 769, 760.02, 762.08, 762.09; 327/538, 539, 541–543, 546, 380, 381, 327/384, 387; 365/185.24; 307/86, 87
See application file for complete search history.

(56) References Cited

U.S. PATENT DOCUMENTS

| | | | | |
|---|---|---|---|---|
| 6,271,709 B1 * | 8/2001 | Kimura et al. | ................. | 327/380 |
| 6,292,342 B1 * | 9/2001 | Miyamoto | ...................... | 361/86 |
| 6,323,668 B1 * | 11/2001 | Hashimoto | ................ | 324/750.3 |
| 6,885,215 B1 * | 4/2005 | Hou et al. | ................ | 324/764.01 |

(Continued)

FOREIGN PATENT DOCUMENTS

| | | |
|---|---|---|
| DE | 23 50 233 A1 | 5/1975 |
| DE | 41 24 344 A1 | 1/1993 |
| DE | 10 2008 027 428 A1 | 12/2009 |
| JP | 2000-058820 A | 2/2000 |

OTHER PUBLICATIONS

Office Action issued for counterpart German Application 10 2011 112 860.7 and English translation thereof.

*Primary Examiner* — Patrick Assouad
*Assistant Examiner* — Alexander J Nemtzow

(57) ABSTRACT

A test apparatus that tests a device under test, including a power supply section that supplies the device under test with power, a comparing section that detects a characteristic value indicating a state of the device under test and compares the characteristic value to a predetermined threshold value, a cutoff section that cuts off the power supplied from the power supply section to the device under test, based on a result of the comparison by the comparing section, and a control section that changes at least one of the threshold value of the comparing section and a detection timing at which the characteristic value is detected.

14 Claims, 5 Drawing Sheets

(56) References Cited

U.S. PATENT DOCUMENTS

| | | | |
|---|---|---|---|
| 7,301,359 B2 * | 11/2007 | Furukawa | 324/750.03 |
| 7,330,046 B2 * | 2/2008 | Durbaum | 324/750.01 |
| 2004/0130345 A1 * | 7/2004 | Farnworth et al. | 324/765 |
| 2006/0198211 A1 * | 9/2006 | Frankowsky | 365/189.09 |
| 2006/0208750 A1 * | 9/2006 | Norris | 324/760 |
| 2008/0111574 A1 * | 5/2008 | Farnworth et al. | 324/763 |
| 2008/0309361 A1 * | 12/2008 | Kita et al. | 324/760 |
| 2010/0007327 A1 * | 1/2010 | Andoh et al. | 324/76.11 |
| 2010/0046123 A1 * | 2/2010 | Fukami | 361/18 |
| 2010/0066392 A1 * | 3/2010 | Furukawa | 324/691 |
| 2010/0226149 A1 * | 9/2010 | Masumoto | 363/20 |
| 2011/0068818 A1 * | 3/2011 | Fukami | 324/762.01 |

* cited by examiner

TEST APPARATUS WITH POWER CUTOFF SECTION HAVING VARIABLE MAXIMUM AND MINIMUM THRESHOLDS

BACKGROUND

1. Technical Field

The present invention relates to a test apparatus.

2. Related Art

A device using an element such as an IGBT is known to be used as a switching device in a large-current circuit. In this device, a plurality of IGBT elements are formed in parallel, according to the desired current specifications, as described in Patent Document 1, for example. A test apparatus that tests the device supplies power from a common power supply to the plurality of IGBTs.

Patent Document 1: Japanese Patent Application Publication No. 2000-58820

One type of test for a large-current switching device is a withstand voltage test that involves applying a high voltage to the device, such as in an avalanche test. However, if there is variation in the characteristics of the elements provided in parallel in the device, the current is focused in a portion of the elements, which can damage the elements. Since a plurality of elements are formed on a common substrate, if a portion of the elements are damaged and heat is generated due to excessive current flowing therethrough, the heat is spread to other elements. As a result, the other elements are also damaged. When this damage spreads, the elements in the device are damaged in a manner similar to an avalanche.

One method used to prevent this type of damage to the elements involves forming in the test apparatus a cutoff circuit that cuts off the power supply when a prescribed current value is detected. However, it is necessary to determine, for each device and each type of test, under what conditions the power should be cut off. Therefore, it is necessary to form a cutoff circuit for each cutoff condition.

SUMMARY

Therefore, it is an object of an aspect of the innovations herein to provide a test apparatus, which is capable of overcoming the above drawbacks accompanying the related art. The above and other objects can be achieved by combinations described in the independent claims. According to a first aspect of the present invention, provided is a test apparatus that tests a device under test, comprising a power supply section that supplies the device under test with power; a comparing section that detects a characteristic value indicating a state of the device under test and compares the characteristic value to a predetermined threshold value; a cutoff section that cuts off the power supplied from the power supply section to the device under test, based on a result of the comparison by the comparing section; and a control section that changes at least one of the threshold value of the comparing section and a detection timing at which the characteristic value is detected.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
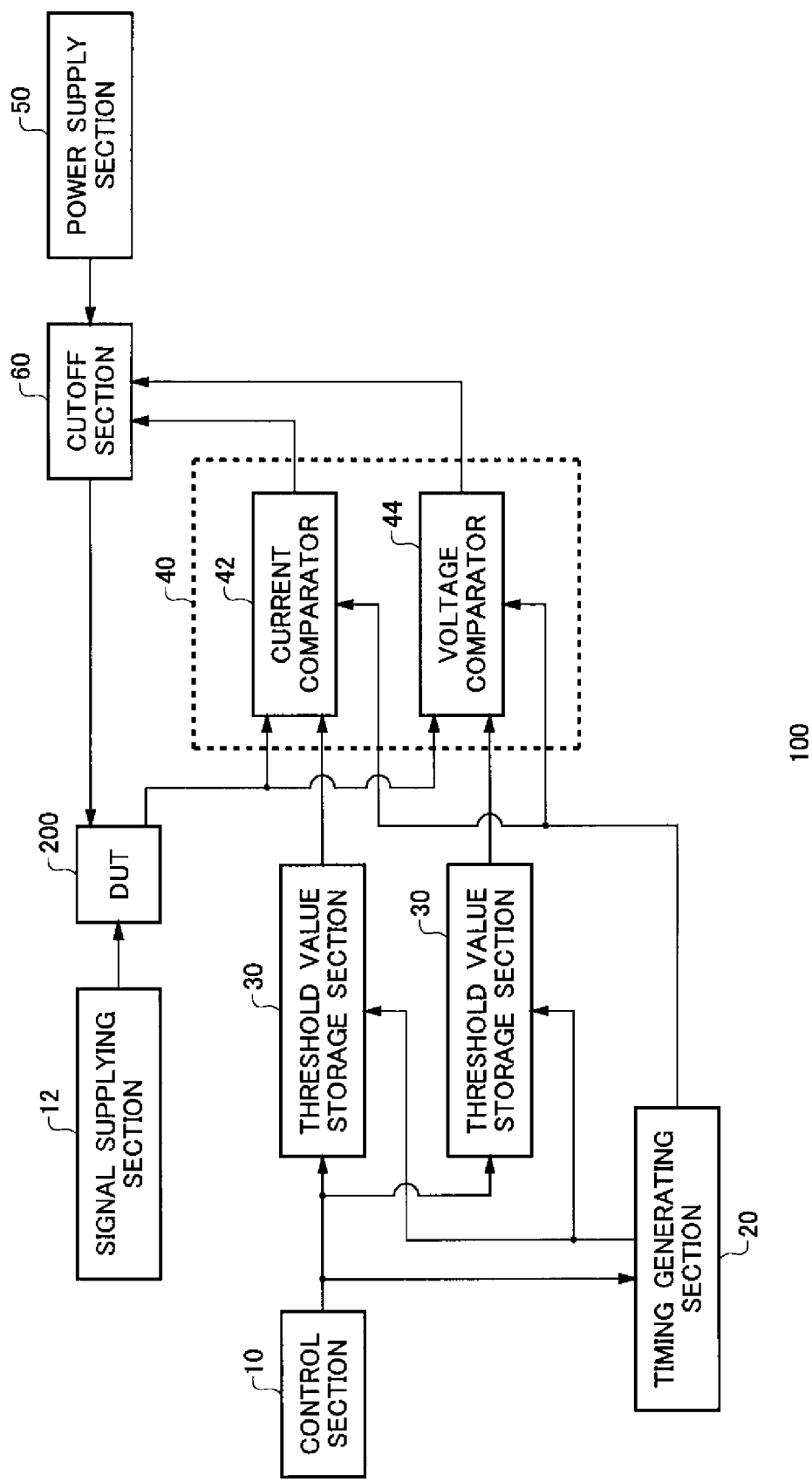
FIG. 1 shows an exemplary configuration of a test apparatus 100 for testing a device under test 200, along with the device under test 200.

FIG. 1 shows an exemplary configuration of a test apparatus 100 for testing a device under test 200, along with the device under test 200. The device under test 200 may include a switching device with high withstand voltage and large current, such as an IGBT. The device under test 200 may include a plurality of switching elements formed in parallel on a common substrate.

The device under test 200 may be a device that has a withstand voltage from several hundred V to several thousand V and that can handle a current from several A to several hundred A. The device under test 200 may be equipment for a vehicle.

The test apparatus 100 includes a control section 10, a signal supplying section 12, a timing generating section 20, a threshold value storage section 30, a comparing section 40, a power supply section 50, and a cutoff section 60. The control section 10 controls the components of the test apparatus 100. The control section 10 may supply a signal to each component of the test apparatus 100 and receive a signal from each component of the test apparatus 100. The control section 10 may control each component according to a program supplied by a user of the test apparatus 100. The control section 10 and the components of the test apparatus 100 are connected to each other by a read/write (R/W) bus.

The signal supplying section 12 supplies the device under test 200 with a test signal that causes the device under test 200 to operate. For example, the signal supplying section 12 may generate a test signal that turns a switching element ON/OFF in the device under test 200. The test apparatus 100 may judge pass/fail of the device under test 200 based on current or voltage applied to the device under test 200 in response to the test signal, or based on current or voltage output by the device under test 200 in response to the test signal.

The power supply section 50 supplies power to the device under test 200. For example, the test signal supplied by the signal supplying section 12 may be applied to a gate terminal of the switching element in the device under test 200, and a power supply voltage supplied by the power supply section 50 may be applied to the collector terminal or the emitter terminal of the switching element, or to the source terminal or drain terminal of the switching element. The power supply section 50 also supplies current flowing through the emitter-collector junction of the switching element.

The comparing section 40 detects a characteristic value indicating a state of the device under test 200, and compares the characteristic value to a predetermined threshold value. The threshold value may include a maximum threshold and a minimum threshold. The characteristic value may be a value of an electrical characteristic such as the current value or voltage value output by the device under test 200. The characteristic value may include a non-electrical characteristic value such as temperature within the device under test 200.

The comparing section 40 may detect the characteristic value at a plurality of detection timings supplied from the timing generating section 20. The comparing section 40 may detect whether the characteristic value changes in a predetermined manner. In this case, the threshold value supplied to the comparing section 40 may be changed for each detection timing.

The comparing section 40 may detect a plurality of types of characteristic values. The types of characteristic values may be voltage values, current values, temperatures, or the like. The comparing section 40 of the present embodiment includes a current comparator 42 and a voltage comparator 44 to detect a current value and a voltage value. The comparing section 40 may detect the voltage or current output by the device under test 200, or may detect the voltage or current applied to the device under test 200. The comparing section 40 may detect voltage or current output by the power supply section 50.

The comparing section 40 may detect the characteristic value, such as the voltage, current, or temperature, via a test terminal or a monitor terminal provided to the device under test 200. The test terminal may be a terminal for supplying power or a test signal to the device under test 200, or may be a terminal through which the device under test 200 outputs voltage, current, or a signal.

The monitor terminal may be a terminal for outputting a signal indicating the characteristic value at a measurement point within the device under test 200. The measurement point may be a node to which a plurality of switches are connected, for example. A voltage level corresponding to a characteristic value of current or temperature, for example, may be output from the monitor terminal. The test terminal and the monitor terminal may be terminals that are not used during actual operation of the device under test 200.

The current comparator 42 may detect the current value output by the device under test 200 at the detection timing, for example. The current comparator 42 compares the detected current value to a predetermined threshold value. The voltage comparator 44 may detect the emitter-collector voltage of the device under test 200 at the detection timing, for example. The voltage comparator 44 compares the detected voltage value to a predetermined threshold value.

The threshold value storage section 30 stores the threshold values received from the control section 10, and supplies the threshold values to the comparing section 40. A threshold value storage section 30 may be provided for each type of characteristic value detectable by the comparing section 40. The threshold value storage section 30 stores overwrites and stores the corresponding threshold value. The control section 10 sequentially stores, in the threshold value storage section 30, the threshold values sequentially designated by a program of the user, for example.

The timing generating section 20 generates a timing signal having an edge at a timing corresponding to a setting value that is set by the control section 10. The detection timing is defined by this edge timing. The timing generating section 20 stores the setting value of the detection timing in a manner to be overwritable. The control section 10 sets, for the timing generating section 20, one or more setting values that are designated by a program of the user, for example.

The cutoff section 60 cuts off the power supplied from the power supply section 50 to the device under test 200, based on the comparison results of the comparing section 40. The cutoff section 60 may include a switch that is provided in a transmission path on which the power is transmitted from the power supply section 50 to the device under test 200 and that controls whether this transmission path is electrically cut off.

The cutoff section 60 may cut off the power when the comparing section 40 indicates that one of the characteristic values is outside of a range determined by the threshold values. The cutoff section 60 may cut off the supplied power according to a comparison result between a threshold value and a predetermined type of characteristic value from among the types of characteristic values that can be detected by the comparing section 40. The cutoff section 60 may cut off the supplied power when all characteristic values of a plurality of predetermined types from among the types of characteristic values that can be detected by the comparing section 40 are outside of a range defined by threshold values.

The control section 10 may set which type of characteristic value is used in the comparison to determine whether the cutoff section 60 cuts off the supplied power. The comparing section 40 or the cutoff section 60 may include a setting section that stores this setting. The setting section stores this setting in a manner to be overwritable. The control section 10 sequentially sets a setting for sequential designation according to a program of the user, for example, in the setting section.

The control section 10 is able to change at least one of a threshold value stored in the threshold value storage section 30 and a setting value that defines the timing at which the timing generating section 20 generates the detection timing. The control section 10 of the present embodiment changes both the threshold value and the setting value of the detection timing, even during a test execution period from when the power is supplied from the power supply section 50 to the device under test 200 until when the supplied power is cut off. In the manner described above, the control section 10 can further change the setting for when the cutoff section 60 cuts off the supplied power, by using the comparison result of each type of characteristic value.

With this configuration, the control section 10 can set a variety of conditions for cutting off the power supplied to the device under test 200. As a result, the power can be cut off for tests of a variety of devices under test 200 and a variety of types of tests. Therefore, it is not necessary to set a specialized test circuit for each device under test 200 or each type of test. Furthermore, since the threshold values are changed dynamically, a prescribed allowable range can be set even for a characteristic value waveform such as slope of the change in the characteristic value.

Figure 2:
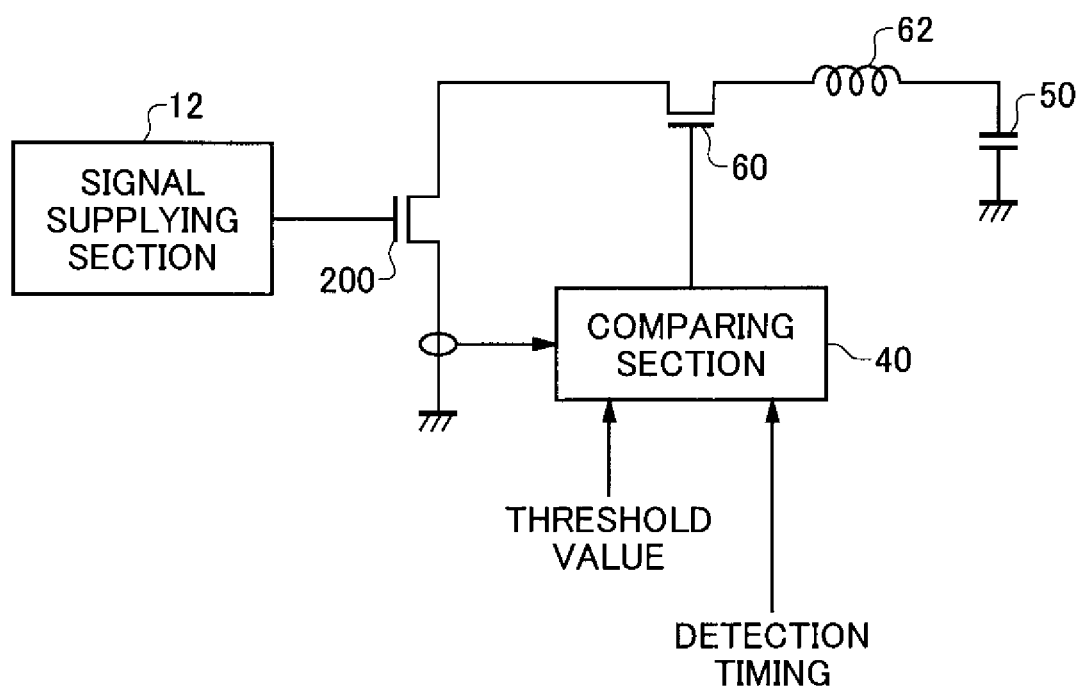
FIG. 2 shows an exemplary cutoff section 60.

FIG. 2 shows an exemplary cutoff section 60. Components in FIG. 2 that have the same function and configuration as components shown in FIG. 1 may be given the same reference numerals. The test apparatus 100 of the present embodiment includes an inductance component 62 in the transmission path through which the power is supplied from the power supply section 50 to the device under test 200.

The cutoff section 60 includes a transistor that is provided in the transmission path between the inductance component 62 and the device under test 200. The transistor may be an IGBT, for example. As another example, the transistor may be provided in the transmission path between the inductance component 62 and the power supply section 50. When the characteristic value detected at the detection timing is outside the range defined by the threshold values, the comparing section 40 turns the transistor OFF.

The power supply section 50 may supply power in parallel to a plurality of elements under test provided in the device under test 200. The elements under test may be IGBTs, for example. The comparing section 40 may compare the current or voltage applied to the elements under test to the threshold value. For example, the comparing section 40 may compare the sum of the current flowing through each element under test, i.e. the current flowing through the device under test 200, to a threshold value. The cutoff section 60 may stop supplying power to all of the elements under test, based on the comparison result of the comparing section 40.

Figure 3:
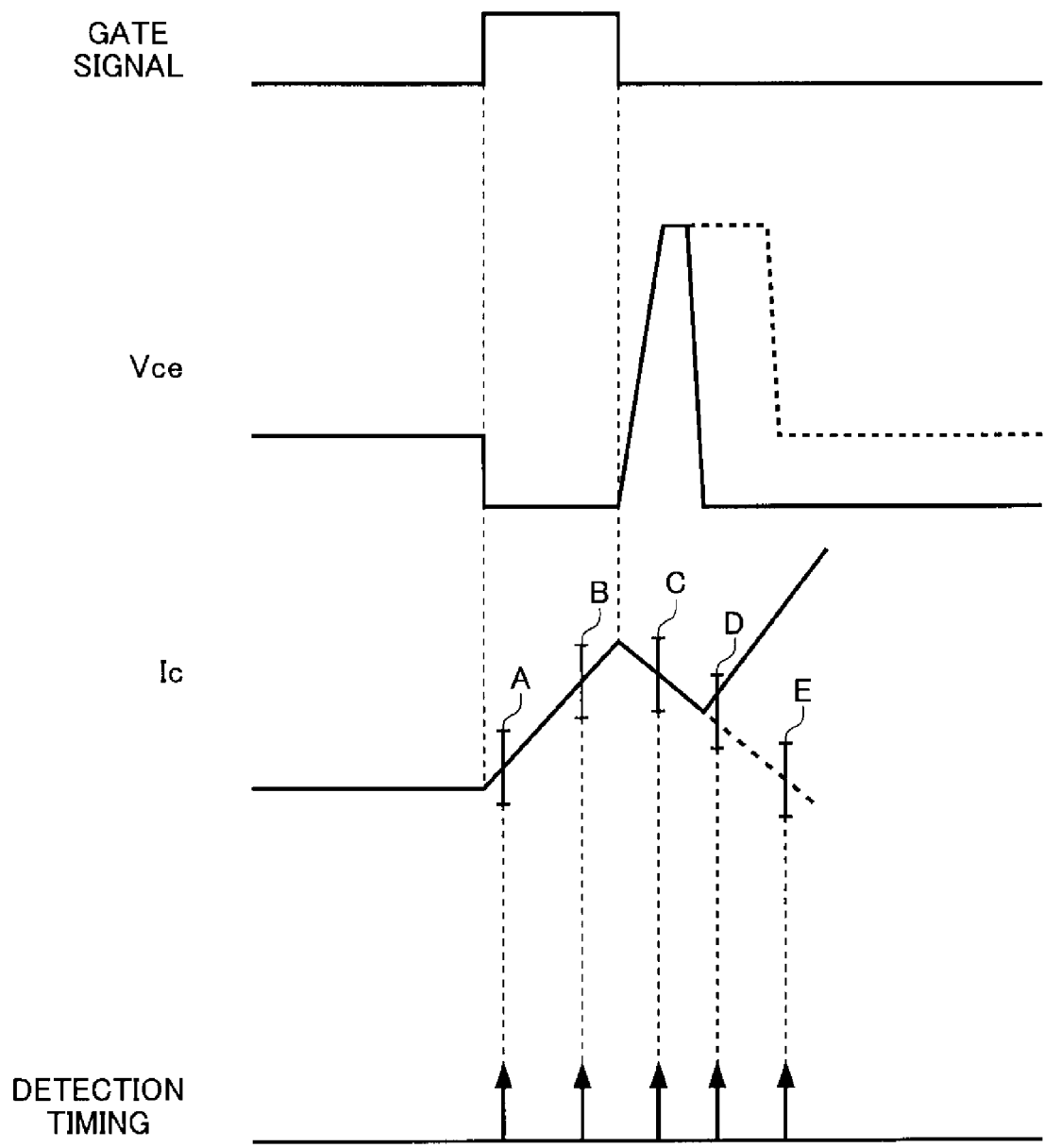
FIG. 3 is a timing chart showing an exemplary test of the device under test 200.

FIG. 3 is a timing chart showing an exemplary test of the device under test 200. In this example, the test apparatus 100 performs an avalanche test of the device under test 200. In an avalanche test, the withstand voltage of the device under test 200 is tested using counter electromotive force generated by the inductance component 62 when the device under test 200 changes from an ON state to an OFF state.

The signal supplying section 12 generates a gate signal that causes the gate terminal of the device under test 200 to change from the OFF state to the ON state and from the ON state to the OFF state. When the device under test 200 changes to the ON state, the emitter-collector voltage Vice drops until reaching a potential corresponding to an ON resistance, i.e. a potential near a ground potential. At this time, the collector current Ic increases with a prescribed slope.

When the device under test 200 changes to the OFF state, the collector current Ic decreases. At this time, the counter electromotive force generated by the inductance component 62 according to the decrease of the collector current Ic is applied to the device under test 200, and therefore the emitter-collector voltage increases. If the device under test 200 can withstand the application of the voltage caused by the counter electromotive force until the collector current Ic stops flowing, the collector current Ic becomes approximately zero and the emitter-collector voltage Vice becomes the prescribed potential, as shown by the dotted line.

However, if the withstand voltage of the device under test 200 is insufficient, the collector current Ic increases and causes an excessive current when a short circuit mode problem occurs. Therefore, the avalanche test preferably detects the short circuit mode problem and cuts off the supplied power.

The current comparator 42 judges whether the value of the collector current Ic at the detection timing is within a range defined by predetermined threshold values. In the present example, the current comparator 42 detects the value of the collector current Ic at a plurality of detection timings, and judges whether each current value is within the prescribed range. At this time, the ranges A to E input from the threshold value storage section 30 to the current comparator 42 may be changed for each detection timing.

The control section 10 may sequentially overwrite the threshold value stored in the threshold value storage section 30. The control section 10 may store in advance, in the threshold value storage section 30, a plurality of threshold values corresponding to a plurality of detection timings. In this case, the threshold value storage section 30 may input the threshold value corresponding to each detection timing generated by the timing generating section 20 to the comparing section 40, according to the detection timing. The threshold value storage section 30 may include a queue in which the threshold values are arranged in the order to be input to the comparing section 40, and may input the leading threshold value into the comparing section 40 for each detection timing generated by the timing generating section 20.

The current comparator 42 judges whether the detected current value is within the range defined by the corresponding threshold values. In the present example, the current value is outside of the range E. The cutoff section 60 cuts off the supplied current at this detection timing. As a result, an excessive current is prevented from flowing through the device under test 200.

The cutoff section 60 may judge whether to cut off the supplied power based on a comparison result of the voltage comparator 44. The voltage comparator 44 may receive a different detection timing than the current comparator 42.

The comparing section 40 may compare the threshold values to a maximum value or a minimum value of the characteristic value within a preset period. This period is set in a manner to be overwritable by the control section 10. This period and the detection timing may be set using the edge timing of the gate signal as a reference. In other words, the period and the detection timing may be defined by delay amounts with respect the edge timing of the gate signal.

Figure 4:
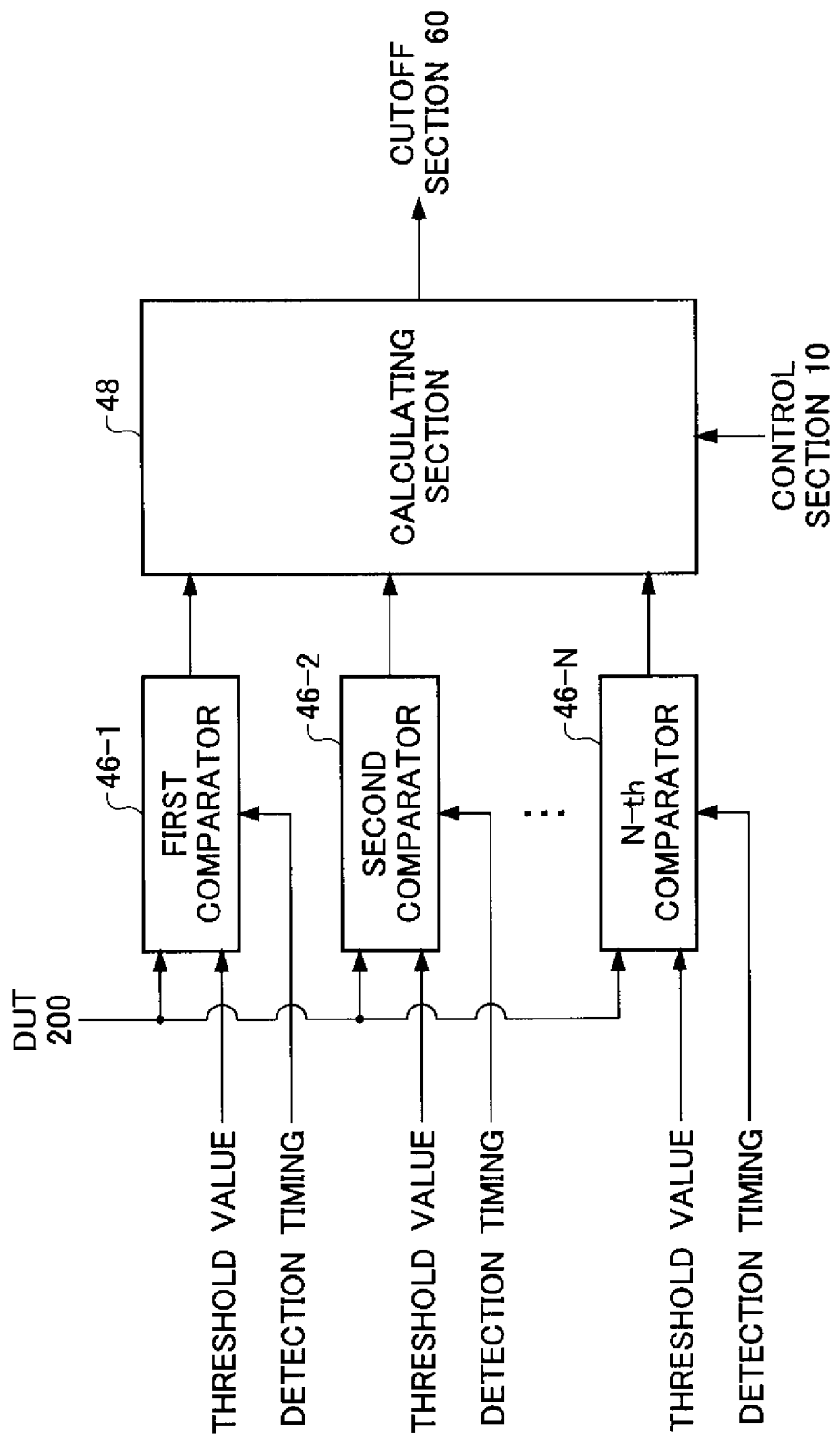
FIG. 4 shows another exemplary configuration of the comparing section 40.

FIG. 4 shows another exemplary configuration of the comparing section 40. The comparing section 40 of the present embodiment includes a plurality of comparators 46-1 to 46-N and a calculating section 48. A threshold value storage section 30 is provided for each comparator 46. Each comparator 46 detects one of a plurality of types of characteristic values.

The calculating section 48 controls the cutoff section 60 based on the comparison results of one or more comparators 46. The control section 10 may set, for the calculating section 48, which comparator's 46 comparison results are used to control the cutoff section 60. The calculating section 48 performs a logic operation, such as an AND or an OR, on the selected comparison results. The control section 10 sets which logic operation is performed by the calculating section 48.

The setting concerning which logic operation the calculating section 48 performs can be overwritten by the control section 10. The control section 10 may change this setting at any time, even while power is being supplied from the power supply section 50 to the device under test 200 or while testing is being performed.

Two or more of the comparators 46 may detect the same type of characteristic value. In this case, a different detection timing may be input to each of the two or more comparators 46. The comparing section 40 may include, for each comparator 46, a delay element that delays the detection timing generated by the timing generating section 20. A threshold value corresponding to the input detection timing may be input to each of the two or more comparators 46.

The detection timing input to each comparator 46 may be dynamically changed by the control section 10 during testing. As a result, the calculating section 48 can receive comparison results for the same type of characteristic value at different detection timings. The calculating section 48 may control the cutoff section 60 based on the results of the logic operations being performed on the comparison results. With this configuration, the supplied power can be cut off based on a variety of judgment conditions.

Figure 5:
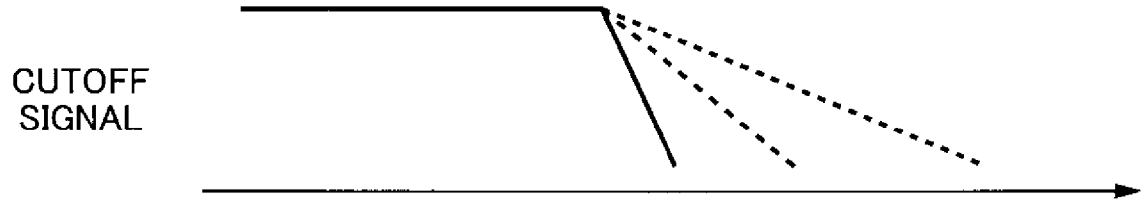
FIG. 5 shows an exemplary operation of the cutoff section 60.

FIG. 5 shows an exemplary operation of the cutoff section 60. The cutoff section 60 may change the rate at which the supplied power is cut off, according to the threshold values at the time when the comparing section 40 judges the detected characteristic value to be out of the prescribed range. For example, the cutoff section 60 may change the slope of the edge of a cutoff signal that controls whether the transistor in the transmission path of the supplied power is turned ON and OFF, according to the threshold values of the comparing section 40. In FIG. 5, logic L indicates that the cutoff signal controls the transistor to be in the OFF state.

For example, when a threshold value of the comparing section 40 is larger, the cutoff section 60 decreases the slope of the edge of the cutoff signal. When a relatively high voltage or large current flows through the transmission path, the transistor of the cutoff section 60 can be protected by lowering the cutoff rate of the transistor.

The control section 10 may read the threshold values, detection timing, or the like when the cutoff section 60 cuts off the supplied power. The control section 10 may notify the user about the settings for the threshold values and detection timings, along with notification that the supplied power has been cut off.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that tests a device under test, comprising:
   a power supply section that supplies the device under test with power;
   a comparing section that detects a characteristic value indicating a state of the device under test at a plurality of detection timings, the characteristic value being a voltage or current output by the device under test in response to a test signal supplied to the device under test, and, for each of the plurality of detection timings, compares the characteristic value to a predetermined maximum threshold value and a predetermined minimum threshold value;
   a cutoff section that cuts off the power supplied from the power supply section to the device under test, based on a result of the comparison by the comparing section; and
   a control section that, in accordance with the plurality of detection timings, changes the predetermined maximum threshold value and the predetermined minimum threshold value of the comparing section while the characteristic value is changing in response to the test signal.

2. The test apparatus according to claim 1, wherein
   the comparing section detects a plurality of types of characteristic values and compares each type of characteristic value to a corresponding predetermined threshold value, and
   the control section further changes a setting concerning which type of characteristic value's comparison result is used to determine whether the cutoff section cuts off the supplied power.

3. The test apparatus according to claim 2, wherein
   the control section includes a threshold value storage section for each type of characteristic value, and each threshold value storage section stores the corresponding predetermined threshold value in a manner to be overwritable.

4. The test apparatus according to claim 3, wherein
   the power supply section supplies the power in parallel to a plurality of elements under test provided in the device under test,
   the comparing section compares voltage or current applied to the elements under test to a threshold voltage value or a threshold current value, and
   the cutoff section stops supplying the power to all of the elements under test, based on the comparison result of the comparing section.

5. The test apparatus according to claim 1, wherein
   the cutoff section changes a rate at which the supplied power is cut off, according to the threshold value at a time when the comparing section judges the detected characteristic value to be outside a prescribed range.

6. The test apparatus according to claim 2, wherein
   the plurality of types of characteristic values includes two or more of a voltage output by the device under test, a current output by the device under test, a temperature within the device under test, a voltage applied to the device under test, a current applied to the device under test, a voltage output by the power supply section, and a current output by the power supply section.

7. The test apparatus according to claim 3, wherein
   the plurality of types of characteristic values includes two or more of a voltage output by the device under test, a current output by the device under test, a temperature within the device under test, a voltage applied to the device under test, a current applied to the device under test, a voltage output by the power supply section, and a current output by the power supply section.

8. A test apparatus that tests a device under test, comprising:
   a power supply section that supplies the device under test with power;
   a comparing section that detects a characteristic value indicating a state of the device under test at a plurality of detection timings, the characteristic value being a temperature within the device under test in response to a test signal supplied to the device under test, and, for each of the plurality of detection timings, compares the characteristic value to a predetermined maximum threshold value and a predetermined minimum threshold value;
   a cutoff section that cuts off the power supplied from the power supply section to the device under test, based on a result of the comparison by the comparing section; and
   a control section that, in accordance with the plurality of detection timings, changes the predetermined maximum threshold value and the predetermined minimum threshold value of the comparing section while the characteristic value is changing in response to the test signal.

9. The test apparatus according to claim 8, wherein
   the comparing section detects a plurality of types of characteristic values and compares each type of characteristic value to a corresponding predetermined threshold value, and
   the control section further changes a setting concerning which type of characteristic value's comparison result is used to determine whether the cutoff section cuts off the supplied power.

10. The test apparatus according to claim 9, wherein
    the control section includes a threshold value storage section for each type of characteristic value, and each threshold value storage section stores the corresponding predetermined threshold value in a manner to be overwritable.

11. The test apparatus according to claim 10, wherein
the power supply section supplies the power in parallel to a plurality of elements under test provided in the device under test,
the comparing section compares voltage or current applied to the elements under test to a threshold voltage value or a threshold current value, and
the cutoff section stops supplying the power to all of the elements under test, based on the comparison result of the comparing section.

12. The test apparatus according to claim 10, wherein
the plurality of types of characteristic values includes two or more of a voltage output by the device under test, a current output by the device under test, a temperature within the device under test, a voltage applied to the device under test, a current applied to the device under test, a voltage output by the power supply section, and a current output by the power supply section.

13. The test apparatus according to claim 9, wherein
the plurality of types of characteristic values includes two or more of a voltage output by the device under test, a current output by the device under test, a temperature within the device under test, a voltage applied to the device under test, a current applied to the device under test, a voltage output by the power supply section, and a current output by the power supply section.

14. The test apparatus according to claim 8, wherein
the cutoff section changes a rate at which the supplied power is cut off, according to the threshold value at a time when the comparing section judges the detected characteristic value to be outside a prescribed range.

\* \* \* \* \*